US008736310B2

(12) United States Patent
Cheong et al.

(10) Patent No.: US 8,736,310 B2
(45) Date of Patent: May 27, 2014

(54) COMPARATOR WITH OFFSET COMPENSATION AND IMPROVED DYNAMIC RANGE

(75) Inventors: Chee Weng Cheong, Singapore (SG); Dianbo Guo, Singapore (SG); Kien Beng Tan, Singapore (SG)

(73) Assignee: STMicroelectronics Asia Pacific Pte. Ltd., Singapore (SG)

( * ) Notice: Subject to any disclaimer, the term of this patent is extended or adjusted under 35 U.S.C. 154(b) by 183 days.

(21) Appl. No.: 12/971,118

(22) Filed: Dec. 17, 2010

(65) Prior Publication Data

US 2012/0153991 A1    Jun. 21, 2012

(51) Int. Cl.
  *H03K 5/22*    (2006.01)
(52) U.S. Cl.
  USPC .................. 327/63; 327/68; 327/69; 327/85
(58) Field of Classification Search
  USPC ........... 327/52, 53, 58, 60, 62, 63, 65–69, 71, 327/72, 74, 77–81, 88, 89, 96, 127, 246, 327/266, 274, 280, 287, 359, 560–563
  See application file for complete search history.

(56) References Cited

U.S. PATENT DOCUMENTS

| 5,017,805 | A |   | 5/1991  | Kase |
| 5,589,785 | A | * | 12/1996 | Garavan ........................... 327/63 |
| 6,750,704 | B1 | * | 6/2004  | Connell et al. .................... 330/9 |
| 8,072,244 | B1 | * | 12/2011 | Liu et al. ......................... 327/51 |
| 2009/0108938 | A1 | * | 4/2009 | Kao et al. ...................... 330/261 |
| 2009/0179890 | A1 | * | 7/2009 | Nishimura et al. ........... 345/214 |
| 2009/0244056 | A1 | * | 10/2009 | Tsuchi .......................... 345/214 |
| 2010/0237907 | A1 |   | 9/2010 | Santoro et al. |

OTHER PUBLICATIONS

STMicroelectronics Product Description Manual, *STMTO5*, S-Touch® FingerTip Multi-Touch Capacitive Touchscreen Controller, Doc ID 18117 Rev 2, Feb. 2001, pp. 1-16, STMicroelectronics NV, Geneva, Switzerland.

* cited by examiner

*Primary Examiner* — Brandon S Cole
(74) *Attorney, Agent, or Firm* — Wolf, Greenfield & Sacks, P.C.

(57) ABSTRACT

A comparator having first and second stages can provide component offset compensation and improved dynamic range. The first stage can receive first and second input signals and produce first and second output signals. The second stage can be coupled to the first stage to receive the first and second output signals at first and second input terminals of the second stage. The second stage can provide a voltage to the first and second terminals that differs from the supply voltage by less than a voltage of a diode drop. The comparator is operable to receive input voltages that reach the supply voltage.

25 Claims, 6 Drawing Sheets

COMPARATOR WITH OFFSET COMPENSATION AND IMPROVED DYNAMIC RANGE

BACKGROUND

1. Technical Field

The techniques described herein relate generally to comparators and in particular to a comparator with offset compensation and improved dynamic range.

2. Discussion of the Related Art

Comparators are used in many applications for comparing two input signals. For example, comparators are important building blocks of analog-to-digital converters (ADCs). An important parameter of a comparator is its resolution, which is the minimum voltage difference that can be detected. The resolution of a comparator can directly limit the accuracy of an ADC.

The mismatch of transistors within a comparator can create an offset voltage that limits the resolution of the comparator. To address this problem, comparators have been designed that compensate for the offset voltage. For example, FIG. 1 shows a comparator 100, as described in U.S. Published Patent Application 2010/0237907, that compensates for the offset voltage of its components, among other functions.

Comparator 100 is formed of a first stage 10 and a second stage 20. The first stage 10 is a pre-amplifier stage that can reduce the output switching noise and amplify the input signal to increase the resolution of the comparator. The first stage 10 substantially forms a voltage/current converter which, during an autozeroing step, stores an offset-compensated bias condition so that the offset voltage can be compensated.

SUMMARY

Some embodiments relate to a comparator having a first stage configured to receive first and second input signals and to produce first and second output signals; and a second stage coupled to the first stage to receive the first and second output signals at first and second input terminals of the second stage. The second stage is configured to receive a supply voltage. The second stage is also configured provide a voltage to the first and second terminals that differs from the supply voltage by less than a voltage of a diode drop.

Some embodiments relate to a comparator having a first stage configured to receive first and second input signals and to produce first and second output signals at first and second output terminals, respectively. The comparator also has a second stage configured to be coupled to a supply voltage and the first and second output terminals of the first stage. The second stage is configured to establish a voltage at one or more of the first and second output terminals that is close enough to the supply voltage to allow operation of the first stage when one or more of the first and second input signals reaches the supply voltage.

Some embodiments relate to a comparator having a first stage configured to receive first and second input signals and to produce first and second output signals. The comparator also has a second stage coupled to the first stage at first and second input terminal of the second stage. The second stage is configured to receive a supply voltage. The second stage includes means for providing a voltage to the first and second terminals that differs from the supply voltage by less than a voltage of a diode drop.

Some embodiments relate to a comparator having first and second stages. The second stage includes a first current source coupled between a first supply voltage and a first input terminal of the second stage. The second stage also includes a second current source coupled between the first supply voltage a second input terminal of the second stage. The second stage further includes a latch coupled between a second supply voltage and the first and second input terminals of the second stage.

The foregoing is a summary of some embodiments that is provided by way of illustration and is not intended to be limiting.

BRIEF DESCRIPTION OF DRAWINGS

In the drawings, each identical or nearly identical component that is illustrated in various figures is represented by a like reference character. For purposes of clarity, not every component may be labeled in every drawing. The drawings are not necessarily drawn to scale, with emphasis instead being placed on illustrating various aspects of the invention.

DETAILED DESCRIPTION

Figure 1:
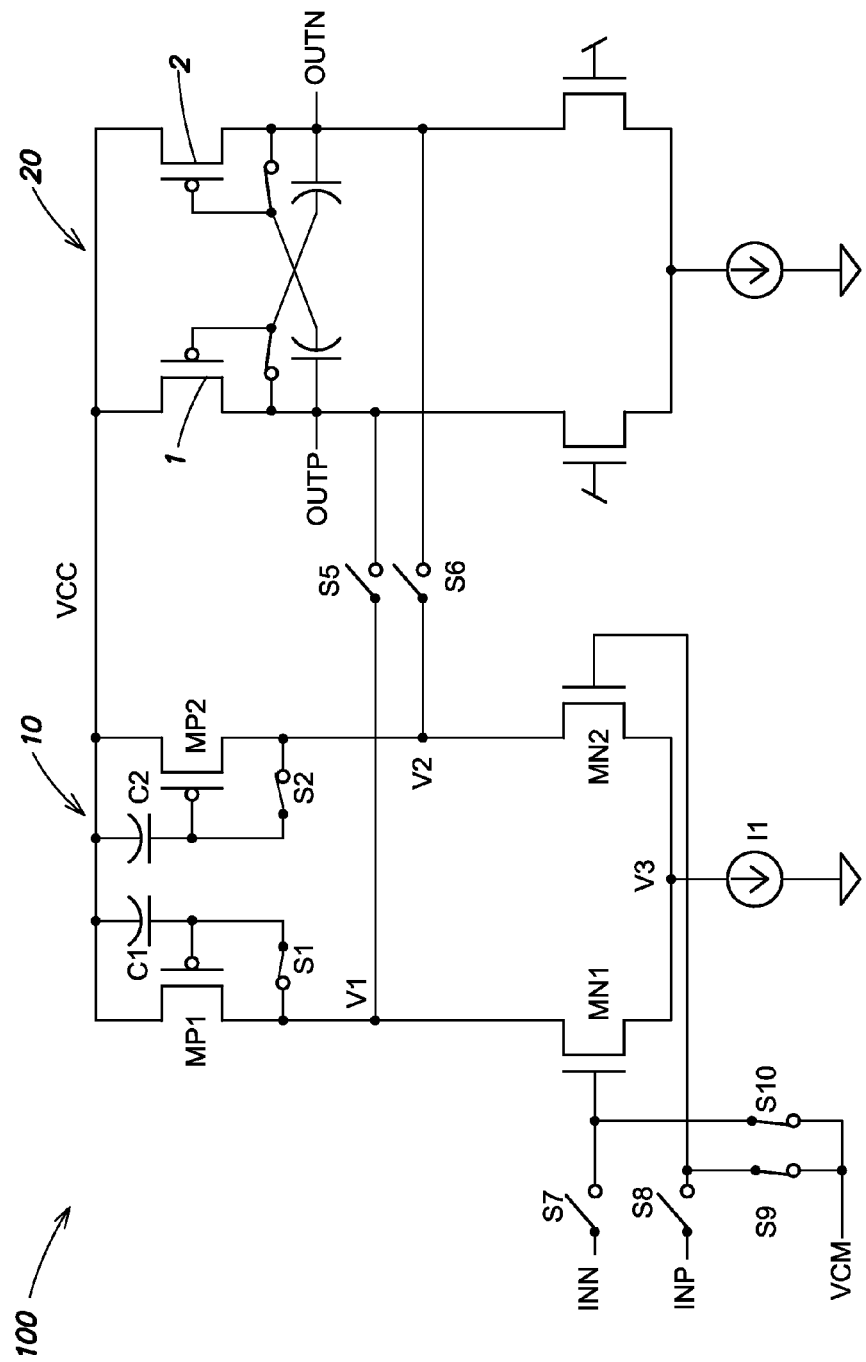
FIG. 1 shows a two-stage comparator as described in U.S. Published Patent Application 2010/0237907.

Although the two-stage comparator architecture of FIG. 1 has various advantages, as described above, it has been appreciated that the comparator 100 may have a limited dynamic range due to the architecture of the second stage 20 of comparator 100. In the circuit of FIG. 1, the voltages V1 and V2 which are provided as inputs to the second stage 20 are limited in value when switches S5 and S6 are turned on because of the voltage drop across the diode-connected PMOS transistors 1 and 2. Voltages V1 and V2 cannot reach a voltage as high as the supply voltage (VCC) because the voltage drop across the diode-connected PMOS transistors 1 and 2 is approximately 0.6 V. For example, if VCC is 1.8 V, the diode drop across PMOS transistors 1 and 2 prevents V1 and V2 from rising above approximately 1.2 V. This constraint on the voltages V1 and V2 limits the allowable range of input voltages INN and INP for comparator 100. When V1 and V2 cannot rise above 1.2 V, the voltage V3 at the common terminal between transistors MN1 and MN2 should not rise above 1.0 V for proper operation of comparator 100. Due to the gate-source voltage of transistors MN1 and MN2 of approximately 0.6 V, the input voltages INN and INP are not allowed to exceed 1.6 V or terminal V3 will be at too high a voltage for proper operation of comparator 100. Since the input voltages INN and INP cannot exceed 1.6 V, and cannot reach the supply voltage of 1.8 V, the dynamic range of the comparator is reduced by approximately 10%.

The Applicants have developed a comparator architecture the reduces the limitations on voltages V1 and V2 and can allow the full range of input voltages INN and INP to be accepted at the input of the comparator. In some embodiments, voltages V1 and/or V2 can reach a value that is close to that of the supply voltage. For example, terminals V1 and V2 can be separated from the supply terminal VCC by current sources having a voltage drop of approximately 0.2 V, which is less than the 0.6 V diode drop of the diode-connected transistors 1 and 2 of comparator 100. This configuration can allow voltages V1 and V2 to reach a higher value.

Figure 2:
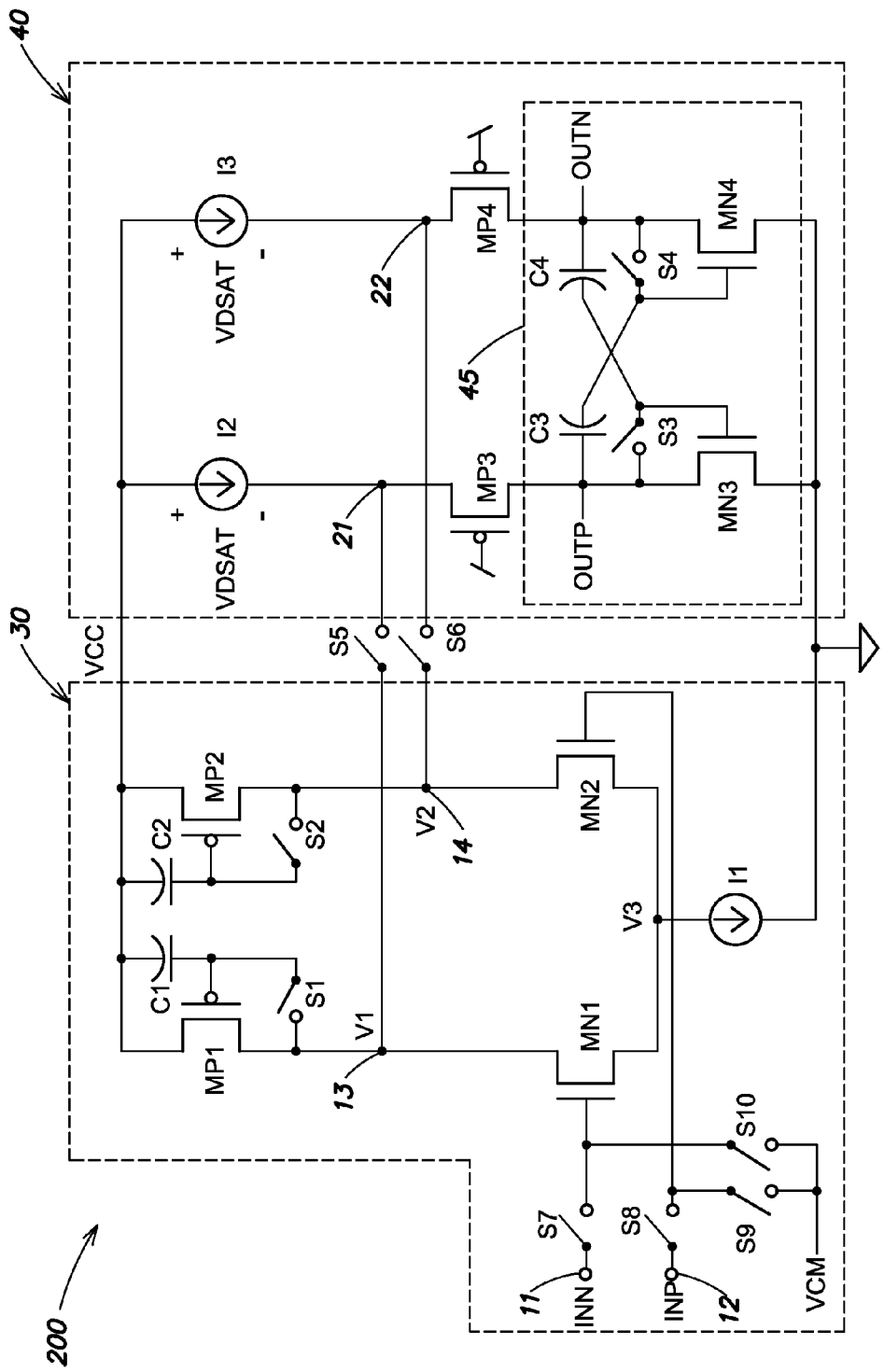
FIG. 2 shows an embodiment of a two-stage comparator with improved dynamic range, according to some embodiments.

FIG. 2 shows an embodiment of a comparator 200 having a first stage 30 and a second stage 40. In some embodiments, first stage 30 of comparator 200 may be substantially the same as first stage 10 of comparator 100. In the embodiment of FIG. 2, first stage 30 comprises a pair of input transistors MN1, MN2, herein of the NMOS type, having gate terminals connectable respectively to input terminal 11 and input terminal 12 through respective switches S7 and S8. The gate terminals of input transistors MN1, MN2 are connectable to a common mode DC voltage VCM through respective switches S10 and S9. First terminals (herein the source terminals) of input transistors MN1, MN2 are connected together at a common terminal having voltage V3, which common terminal is connected to a first current source I1 supplying a bias current. Second terminals (herein drain terminals) of input transistors MN1, MN2 are connected to a respective output 13, 14 of the first stage 30 and to first terminals (herein drain terminals) of a pair of load transistors MP1, MP2, herein of the PMOS type. Second terminals (herein source terminals) of load transistors MP1, MP2 are connected to a supply terminal at a supply voltage VCC. Capacitors C1 and C2 are connected between source and gate terminals of a respective load transistor MP1, MP2. Switches S1 and S2 are connected between the gate and drain terminals of a respective load transistor MP1, MP2.

In comparator 200, the first stage 30 substantially forms a voltage/current converter which stores an offset-compensated bias condition during an autozeroing step. During the subsequent tracking and latching steps, the first stage 30 may generate, on its outputs 13 and 14, current signals that are dependent on input signals INP and INN, independent of the offset caused by component mismatch in the first stage 30.

The outputs 13, 14 of the first stage are connectable to input terminals 21 and 22 of second stage 40 through respective switches S5 and S6. Input terminals 21 and 22 of second stage 40 are connected to current sources I2 and I3, respectively, which are coupled to the supply terminal at VCC. Terminals 13, 14 at voltages V1, V2, respectively, are separated from the supply voltage VCC by current sources I2 and I3. Advantageously, current sources I2 and I3 may have a low voltage drop VDSAT across their terminals, such as approximately 0.2 V. The low voltage drop of 0.2 V across each of the current sources I2, I3 can allow the voltages V1 and V2 to reach 1.6 V when VCC is 1.8 V. When terminals V1 and V2 can reach 1.6 V, the comparator 200 can accept inputs INN and INP having voltages as high as the supply voltage, e.g., 1.8 V. Thus, the dynamic range of the comparator 200 can be higher than the dynamic range of comparator 100 because comparator 200 can accept a wider range of input voltages.

Inputs 21 and 22 of second stage 40 are also connected to first terminals of a pair of bias transistors MP3, MP4, herein of the PMOS type. Second terminals of the bias transistors MP3, MP4 are connected to a latch 45 which includes output transistors MN3, MN4, capacitors C3 and C4, and switches S3 and S4. Specifically, the second terminals of the bias transistors MP3 and MP4 are connected to first terminals of the pair of output transistors MN3, MN4, herein of the NMOS type. The first terminals of the pair of output transistors also form the output terminals OUTP, OUTN of the comparator 200. Second terminals of output transistors MN3, MN4 are connected to a common terminal such as a supply terminal configured to be grounded in operation (i.e., at 0 V). Capacitors C3 and C4 are connected between a first terminal of a respective output transistor MN3, MN4 and the gate terminal of the other output transistor MN3, MN4. Switches S3 and S4 are connected between the gate and first terminals of a respective output transistor MN3, MN4.

Switches S1-S10 receive control signals that control the comparator 200 in a sequence of three steps including an autozeroing step, a tracking step and a latching step. The operation of comparator 200 will now be described with reference to FIGS. 3-5, which show the equivalent circuit of comparator 200 in the autozeroing, tracking and latching steps, respectively.

Autozeroing Step

Figure 3:
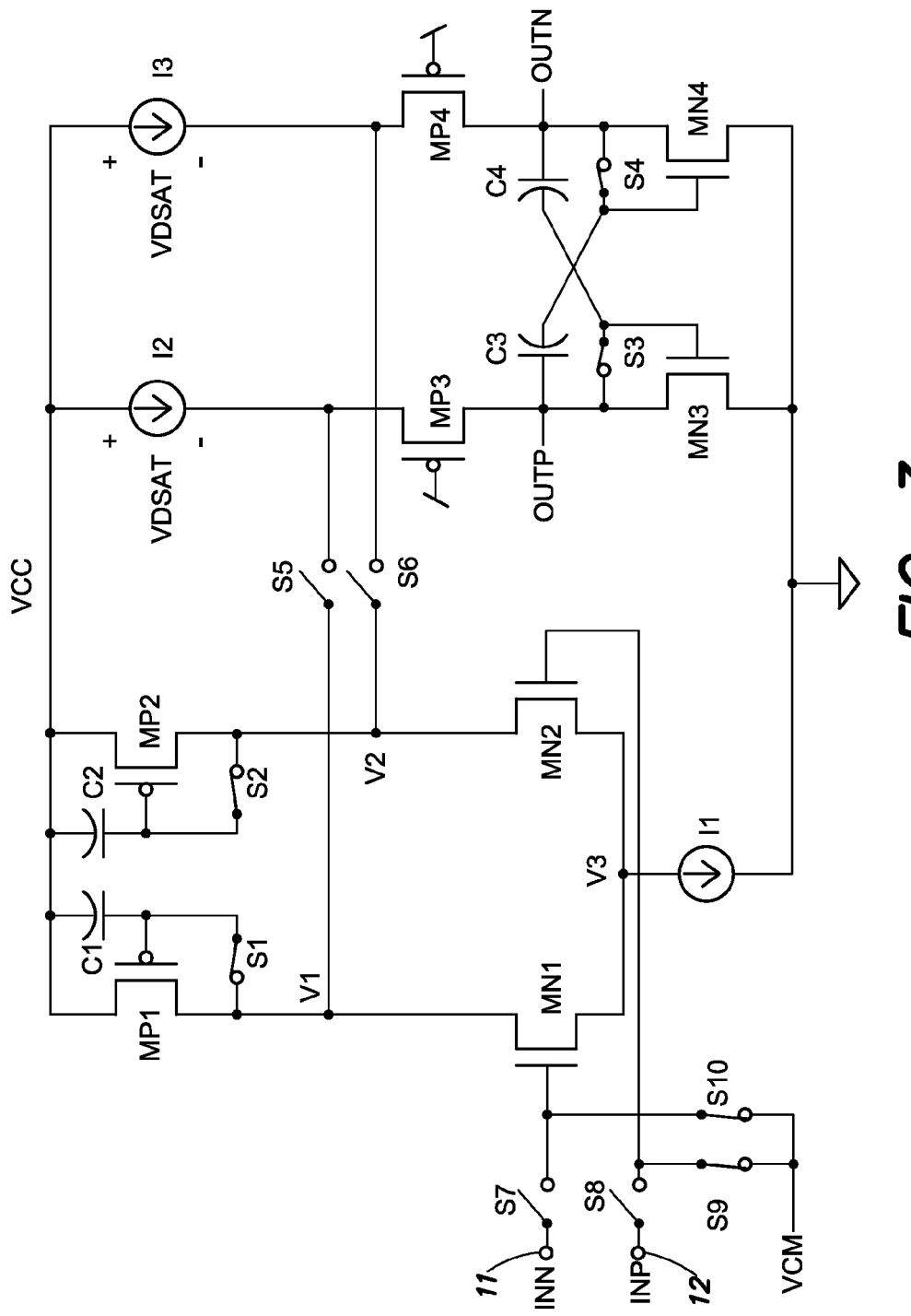
FIG. 3 shows an equivalent circuit representing the comparator of FIG. 2 during an autozeroing step.

FIG. 3 shows the equivalent circuit of comparator 200 in the autozeroing step. As shown in FIG. 3, switches S5, S6, S7, S8, are opened and switches S1, S2, S3, S4, S9 and S10 are closed. Accordingly, the gate terminals of input transistors MN1, MN2 of first stage 30 are connected to common mode DC voltage VCM and disconnected from the input terminals 11, 12; outputs 13 and 14 of first stage 30 are disconnected from second stage 40; load transistors MP1 and MP2 are in a transdiode configuration and second stage 40 is in a reset state. In this configuration, load transistors MP1 and MP2 are respectively biased with the current that is set by input transistors MN1, MN2 connected thereto. During this step, capacitors C1 and C2 store gate-source voltages VGS of load transistors MP1 and MP2. Second stage 40 is maintained in a reset state, with positive feedback of the latch 45 disabled due to switches S3 and S4 being closed.

Tracking Step

Figure 4:
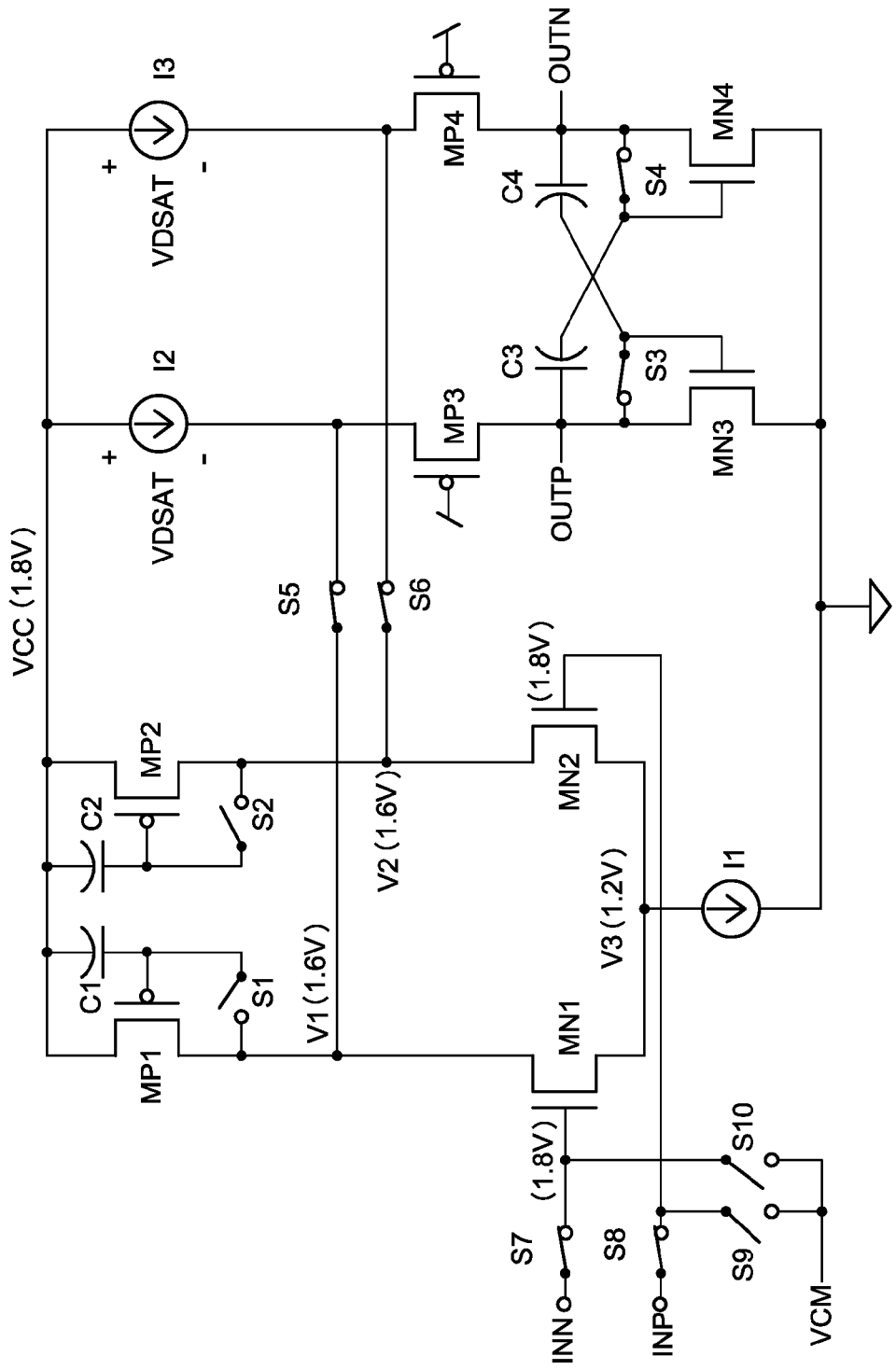
FIG. 4 shows an equivalent circuit representing the comparator of FIG. 2 during a tracking step.

FIG. 4 shows the equivalent circuit of comparator 200 in the tracking step. During the tracking step, switches S9 and S10 are opened and switches S7 and S8 are closed, thereby providing input signals INN and INP to the gates of input transistors MN1 and MN2, respectively. Switches S1 and S2 are opened, causing the gates of transistors MP1 and MP2 to be controlled by the voltages stored on capacitors C1 and C2, respectively. Switches S5 and S6 are closed, connecting first stage 30 to second stage 40 and allowing the signal currents to flow through switches S5 and S6. Switches S3 and S4 remain closed, maintaining output transistors MN3, MN4 in a transdiode configuration. Capacitors C3 and C4 are in parallel to one another and store the voltage existing between outputs OUTP and OUTN of comparator 200 based on offset currents present in second stage 40.

Latching Step

Figure 5:
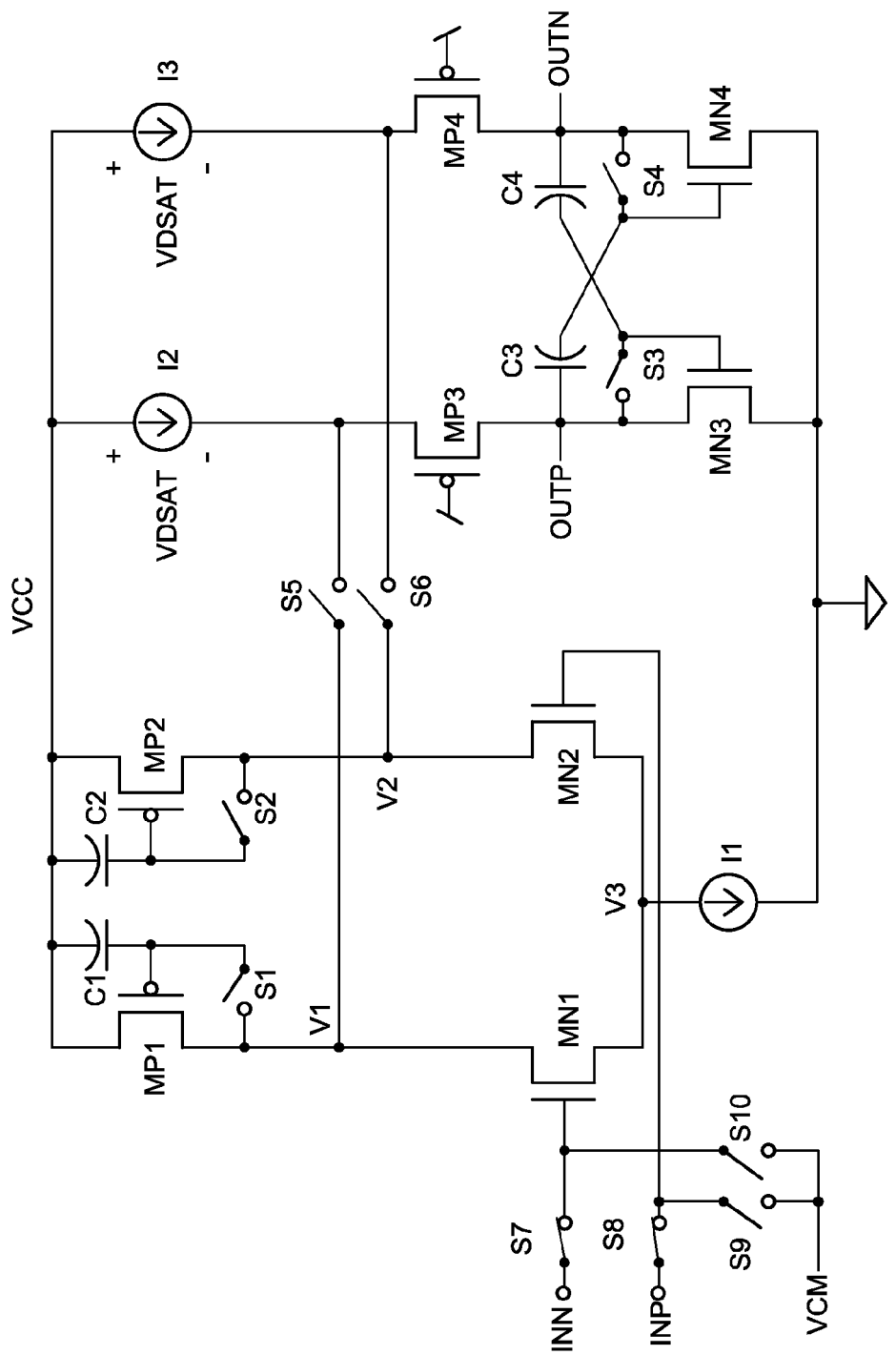
FIG. 5 shows an equivalent circuit representing the comparator of FIG. 2 during a latching step.

FIG. 5 shows the equivalent circuit of comparator 200 in the latching step. During the latching step switches S3, S4, S5, and S6 are opened, while switches S1, S2, S9 and S10 remain open and switches S7 and S8 remain closed. At this point, the second stage 40 is disconnected from the first stage 30. The latch 45 then uses positive feedback to latch one output terminal OUTP or OUTN to a high voltage level and the other output terminal OUTP or OUTN to a low voltage level, depending on the current that was received from the first stage 30 at terminals 21, 22.

Figure 6:
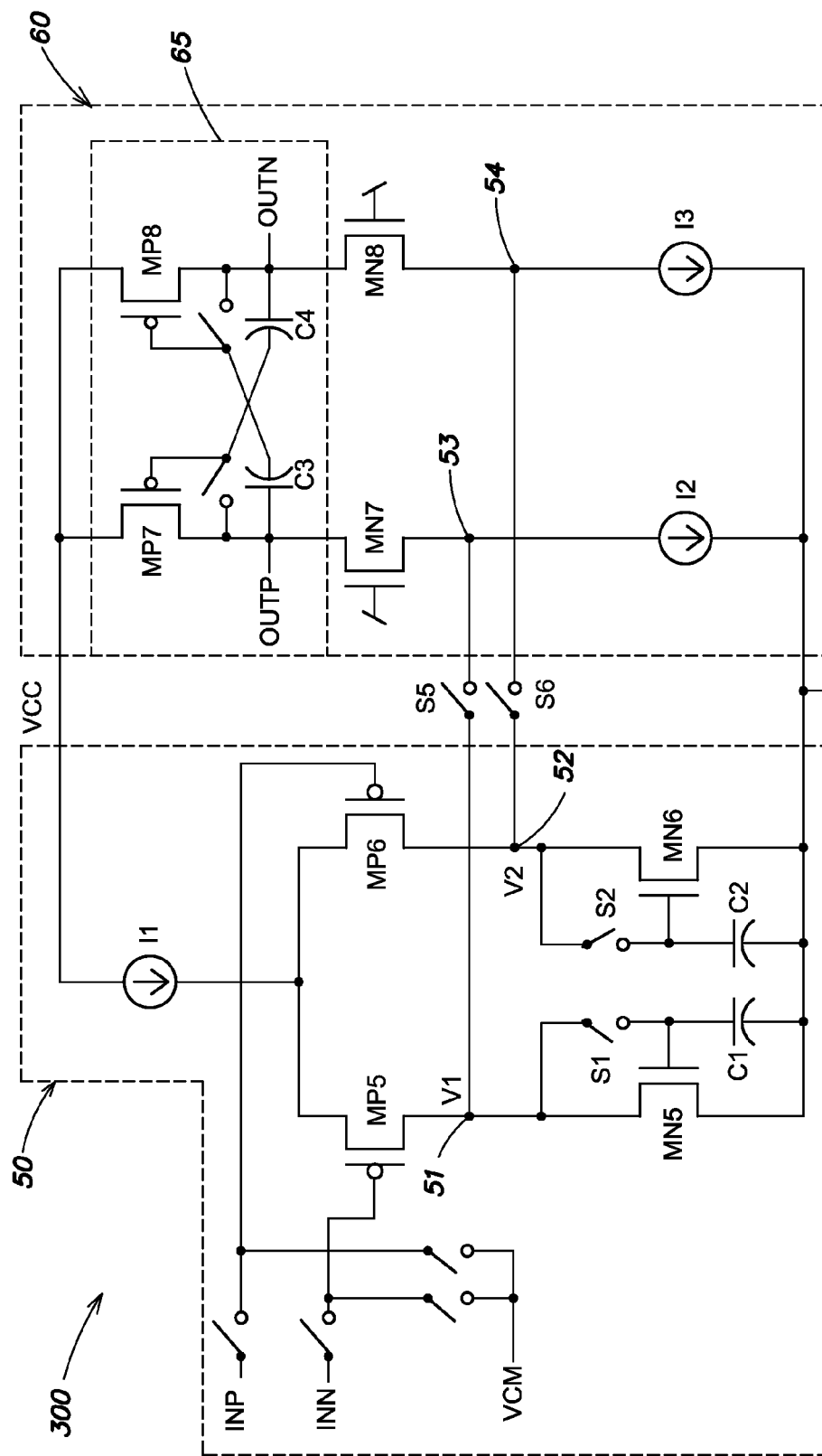
FIG. 6 shows another embodiment of a comparator using an alternative arrangement in which the second stage has current sources between the inputs to the second stage and a ground terminal.

FIG. 6 shows another embodiment of a comparator 300 that includes a first stage 50 and a second stage 60. In the embodiment of FIG. 6, first stage 50 comprises a pair of input transistors MP5, MP6, herein of the PMOS type, having gate terminals connectable respectively to inputs receiving input signals INP and INN through respective switches. The gate terminals of input transistors MP5, MP6 are connectable to a common mode DC voltage VCM through respective switches. First terminals of input transistors MP5, MP6 are connected together and to a first current source I1 supplying a bias current. Second terminals of input transistors MP5, MP6 are connected to a respective output terminal 51, 52 of the first stage 50 and to first terminals of a pair of load transistors MN5, MN6, herein of the NMOS type. Second terminals of load transistors MN5, MN6 are connected to a supply terminal that is configured to be grounded in operation. Capacitors C1 and C2 are connected between source and gate terminals of a respective load transistor MN5, MN6. Switches S1 and S2 are connected between the gate and drain terminals of a respective load transistor MN5, MN6.

In comparator 300, the first stage 50 substantially forms a voltage/current converter which stores an offset-compensated bias condition during an autozeroing step. During the subsequent tracking and latching steps, the first stage 50 may generate, on its outputs 51 and 52, current signals that are dependent on input signals INP and INN, independent of the offset caused by component mismatch in first stage 50.

The outputs 51, 52 of the first stage are connectable to input terminals 53 and 54 of second stage 60 through respective switches S5 and S6. Input terminals 53 and 54 of second stage 40 are connected to current sources I2 and I3, respectively, which are coupled to a supply terminal configured to be grounded in operation. In second stage 60, terminals 53 and 54 at voltages V1, V2, respectively, when switches S5 and S6 are closed, are separated from the ground terminal by current sources I2 and I3. Advantageously, current sources I2 and I3 may have a low voltage drop across their terminals, such as approximately 0.2 V. The low voltage drop of 0.2 V across each of the current sources I2, I3 can allow the voltages V1 and V2 to reach a voltage as low as 0.2 V. When terminals V1 and V2 can reach a voltage as low as 0.2 V, inputs signals INN and INP of the comparator 300 can be as low as 0V. Thus, the dynamic range of the comparator 300 can be relatively high because it can receive input voltages all the way down to 0 V.

Input terminals 53 and 54 of second stage 60 are also connected to first terminals of a pair of bias transistors MN7, MN8, herein of the NMOS type. Second terminals of the bias transistors MN7, MN8 are connected to a latch 65 which includes PMOS output transistors MP7, MP8, capacitors C3 and C4, and two switches. In this embodiment, latch 65 is connected to the supply terminal at VCC.

Comparator 300 may operate in a similar manner to that of comparator 200. However, due to the use of a PMOS differential pair of transistors MP5, MP6, the acceptable input voltages for comparator 300 can be from 0 to VCC/2 volts, as compared to the acceptable input voltages for comparator 200 of VCC/2 to VCC volts.

Modifications and changes can be made to the comparator disclosed and illustrated herein without departing from the scope of the present invention. For example the transistors can be replaced by other equivalent elements, for example bipolar transistors and/or transistors of different type.

This invention is not limited in its application to the details of construction and the arrangement of components set forth in the foregoing description or illustrated in the drawings. The invention is capable of other embodiments and of being practiced or of being carried out in various ways. Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A comparator, comprising:
    a first stage configured to receive first and second input signals and to produce first and second output signals;
    a second stage coupled to the first stage to receive the first and second output signals at first and second input terminals of the second stage, the second stage comprising a node at a supply voltage and at least one circuit element connected between the node and the first and second input terminals of the second stage;
    a first switch coupled between the first stage and the first input terminal of the second stage; and
    a second switch coupled between the first stage and the second input terminal of the second stage,
    wherein electrical characteristics of the at least one circuit element are such that, during operation of the comparator, a voltage drop across the at least one circuit element is less than 0.6 V and greater than or equal to 0.2 V and a difference between a voltage at the first and second input terminals and the supply voltage is less than 0.2 V and greater than or equal to 0 V, and
    wherein the at least one circuit element of the second stage comprises:
        a first current source coupled between the first input terminal of the second stage and the supply voltage, and
        a second current source coupled between the second input terminal of the second stage and the supply voltage.

2. The comparator of claim 1, wherein electrical characteristics of the at least one circuit element are such that, during operation of the comparator, the voltage drop across the at least one circuit element is 0.2 V.

3. The comparator of claim 1, wherein the supply voltage is a first supply voltage and the second stage further comprises:
    a latch coupled between a second supply voltage and the first and second input terminals of the second stage.

4. The comparator of claim 3, wherein the second stage further comprises:
    a first bias transistor coupled between the latch and the first input terminal of the second stage; and
    a second bias transistor coupled between the latch and the second input terminal of the second stage.

5. The comparator of claim 1, wherein:
    the supply voltage is a first supply voltage;
    the second stage further comprises:
        a latch coupled between a second supply voltage and the first and second input terminals of the second stage;
        a first bias transistor coupled between the latch and the first input terminal of the second stage; and
        a second bias transistor coupled between the latch and the second input terminal of the second stage.

6. The comparator of claim 5, wherein the first supply voltage is a positive voltage that is greater than the second supply voltage.

7. The comparator of claim 6, wherein the first supply voltage is approximately 1.8 V or less and the second supply voltage is approximately 0 V.

8. The comparator of claim 5, wherein the first supply voltage is approximately 0 V and the second supply voltage is a positive voltage.

9. The comparator of claim 1, wherein the first stage is configured to amplify the first and second input signals.

10. The comparator of claim 1, wherein:
the comparator further comprises:
a first output terminal of the second stage, and
a second output terminal of the second stage; and
the second stage further comprises:
a latch coupled between the first and second output terminals of the second stage and a second node at a second supply voltage, the latch comprising:
a first transistor coupled between the first output terminal of the second stage and the second node at the second supply voltage, the first transistor comprising a first control terminal, a first conduction terminal, and a second conduction terminal, the second conduction terminal being coupled to the second node at the second supply voltage,
a second transistor coupled between the second output terminal of the second stage and the second node at the second supply voltage, the second transistor comprising a second control terminal, a third conduction terminal, and a fourth conduction terminal,
a third switch coupled between the first conduction terminal of the first transistor and the first control terminal of the first transistor,
a fourth switch coupled between the third conduction terminal of the second transistor and the second control terminal of the second transistor,
a first capacitor connected between the first conduction terminal of the first transistor and the second control terminal of the second transistor, and
a second capacitor connected between the third conduction terminal of the second transistor and the first control terminal of the first transistor.

11. The comparator of claim 10, further comprising:
a first bias transistor coupled between the first input terminal of the second stage and the first output terminal of the second stage; and
a second bias transistor coupled between the second input terminal of the second stage and the second output terminal of the second stage.

12. The comparator of claim 11, wherein the first transistor and the second transistor are each PMOS transistors.

13. A comparator, comprising:
a first stage configured to receive first and second input signals and to produce first and second output signals at first and second output terminals, respectively; and
a second stage configured to be coupled to a supply voltage and the first and second output terminals of the first stage via first and second switches, the second stage comprising a first current source coupled between the first switch and the supply voltage and a second current source coupled between the second switch and the supply voltage
wherein the second stage is configured to establish a voltage at one or more of the first and second output terminals that is close enough to the supply voltage to allow operation of the first stage when one or more of the first and second input signals reaches the supply voltage; and
wherein the voltage established at the first and second output terminals differs from the supply voltage is less than 0.2 V and greater than or equal to 0 V.

14. The comparator of claim 13, wherein the supply voltage is a first supply voltage and the second stage further comprises:
a latch coupled between a second supply voltage and the first and second output terminals.

15. The comparator of claim 14, wherein the second stage further comprises:
a first bias transistor coupled between the latch and the first output terminal and
a second bias transistor coupled between the latch and the second output terminal.

16. The comparator of claim 13, wherein:
the supply voltage is a first supply voltage, and
the second stage further comprises:
a latch coupled between a second supply voltage and the first and second input terminals of the second stage;
a first bias transistor coupled between the latch and the first input terminal of the second stage; and
a second bias transistor coupled between the latch and the second input terminal of the second stage.

17. The comparator of claim 16, wherein the first supply voltage is a positive voltage that is greater than the second supply voltage.

18. The comparator of claim 17, wherein the first supply voltage is approximately 1.8 V or less and the second supply voltage is approximately 0 V.

19. The comparator of claim 16, wherein the first supply voltage is approximately 0 V and the second supply voltage is a positive voltage.

20. The comparator of claim 13, wherein the second stage is configured to establish a voltage at one or more of the first and second output terminals that is close enough to the supply voltage to allow the first stage to amplify the first and second input signals when one or more of the first and second input signals reaches the supply voltage.

21. A comparator, comprising:
a first stage configured to receive first and second input signals and to produce first and second output signals;
a second stage coupled to the first stage at first and second input terminal of the second stage, the second stage being configured to receive a supply voltage, the second stage comprising means for providing a voltage to the first and second terminals that differs from the supply voltage by less than 0.6 V;
a first switch coupled between the first stage and the first input terminal of the second stage; and
a second switch coupled between the first stage and the second input terminal of the second stage,
wherein the means for providing the voltage comprises:
a first current source coupled between the first input terminal of the second stage and the node at the supply voltage, and
a second current source coupled between the second input terminal of the second stage and the node at the supply voltage.

22. The comparator of claim 21, wherein the voltage provided to the first and second terminals differs from the supply voltage by no more than about 0.2 V.

23. A comparator comprising:
a first stage;
a second stage;
a first switch coupled between the first stage and the second stage; and
a second switch coupled between the first stage and the second stage,
wherein the second stage comprises:
a first input terminal electrically connected to a first node of the second stage;
a second input terminal electrically connected to a second node of the second stage;
a third node at a first supply voltage;
a fourth node at a second supply voltage;

a first current source directly electrically connected to the third node at the first supply voltage and to the first node and being arranged to have, during operation of the comparator, a voltage drop of less than 0.6 V;

a second current source directly electrically connected to the third node at the first supply voltage and to the second node and being arranged to have, during operation of the comparator, a voltage drop of less than 0.6 V; and a latch coupled between the fourth node at the second supply voltage and the first and second nodes of the second stage.

24. The comparator of claim 23, wherein the first current source is arranged to have, during operation of the comparator, a voltage drop of 0.2 V.

25. The comparator of claim 23, wherein the second stage further comprises:

a first bias transistor coupled between the latch and the first node; and a second bias transistor coupled between the latch and the second node of the second stage.

\* \* \* \* \*

UNITED STATES PATENT AND TRADEMARK OFFICE
CERTIFICATE OF CORRECTION

| | | |
|---|---|---|
| PATENT NO. | : 8,736,310 B2 | Page 1 of 1 |
| APPLICATION NO. | : 12/971118 | |
| DATED | : May 27, 2014 | |
| INVENTOR(S) | : Cheeweng Cheong et al. | |

It is certified that error appears in the above-identified patent and that said Letters Patent is hereby corrected as shown below:

In the Specification:

\*\*\*At column 5, line 43, "MPS" should read: --MP5--\*\*\*

Signed and Sealed this
Thirtieth Day of September, 2014

Michelle K. Lee
*Deputy Director of the United States Patent and Trademark Office*